(12) United States Patent
Kamiya et al.

(10) Patent No.: US 8,716,732 B2
(45) Date of Patent: May 6, 2014

(54) LIGHT EMITTING ELEMENT

(75) Inventors: Masao Kamiya, Kiyosu (JP); Masashi Deguchi, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 234 days.

(21) Appl. No.: 13/137,540

(22) Filed: Aug. 24, 2011

(65) Prior Publication Data
US 2012/0049219 A1 Mar. 1, 2012

(30) Foreign Application Priority Data

Aug. 27, 2010 (JP) ................................ 2010-190779
Jun. 8, 2011 (JP) ................................ 2011-128390

(51) Int. Cl.
*H01L 33/00* (2010.01)
(52) U.S. Cl.
USPC ............. 257/98; 257/79; 257/15; 257/E33.06
(58) Field of Classification Search
USPC .................... 257/79, 98, 15, E33.06
See application file for complete search history.

(56) References Cited

U.S. PATENT DOCUMENTS

| 2005/0211989 | A1 | 9/2005 | Horio et al. |
| 2005/0212002 | A1 | 9/2005 | Sanga et al. |
| 2007/0176188 | A1 | 8/2007 | Tanaka et al. |
| 2008/0096297 | A1 | 4/2008 | Schiaffino et al. |
| 2010/0171094 | A1 | 7/2010 | Lu et al. |

FOREIGN PATENT DOCUMENTS

| CN | 101595570(A) | 12/2009 |
| DE | 10 2007 019 775 A1 | 10/2008 |
| JP | 2005-302747 A | 10/2005 |
| JP | 2008-288548 A | 11/2008 |
| JP | 2009-164423(A) | 7/2009 |

OTHER PUBLICATIONS

Extended European Search Report dated Jan. 2, 2014.
Japanese Office Action dated Dec. 17, 2013 with partial English translation thereof.
Chinese Office Action with Chinese Search Report dated Nov. 4, 2013.

*Primary Examiner* — Dale E Page
(74) *Attorney, Agent, or Firm* — McGinn IP Law Group, PLLC

(57) ABSTRACT

A light emitting element includes a semiconductor laminate structure including a first semiconductor layer of a first conductivity type, a light emitting layer, and a second semiconductor layer of a second conductivity type different from the first conductivity type, a part of the second semiconductor layer and the light emitting layer being removed to expose a part of the first semiconductor layer, a first reflecting layer on the semiconductor laminate structure and including an opening, the opening being formed in the exposed part of the first semiconductor layer, a transparent wiring electrode for carrier injection into the first semiconductor layer or the second semiconductor layer through the opening, a second reflecting layer formed on the transparent wiring electrode and covering a part of the opening so as to reflect light emitted from the light emitting layer and passing through the opening back to the first semiconductor layer.

9 Claims, 6 Drawing Sheets

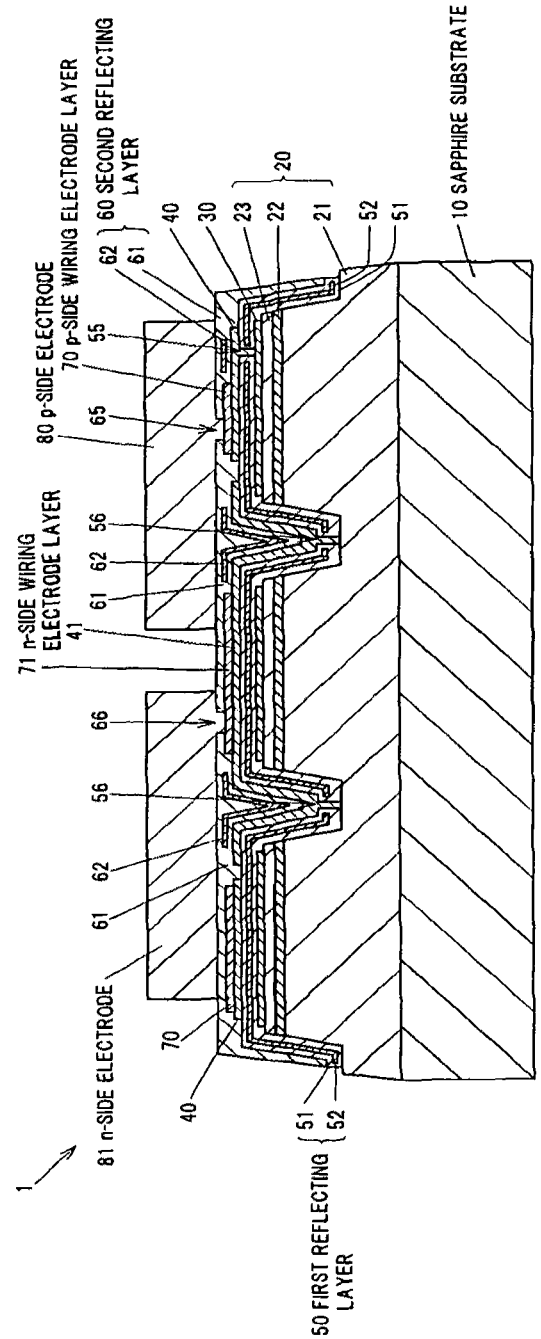

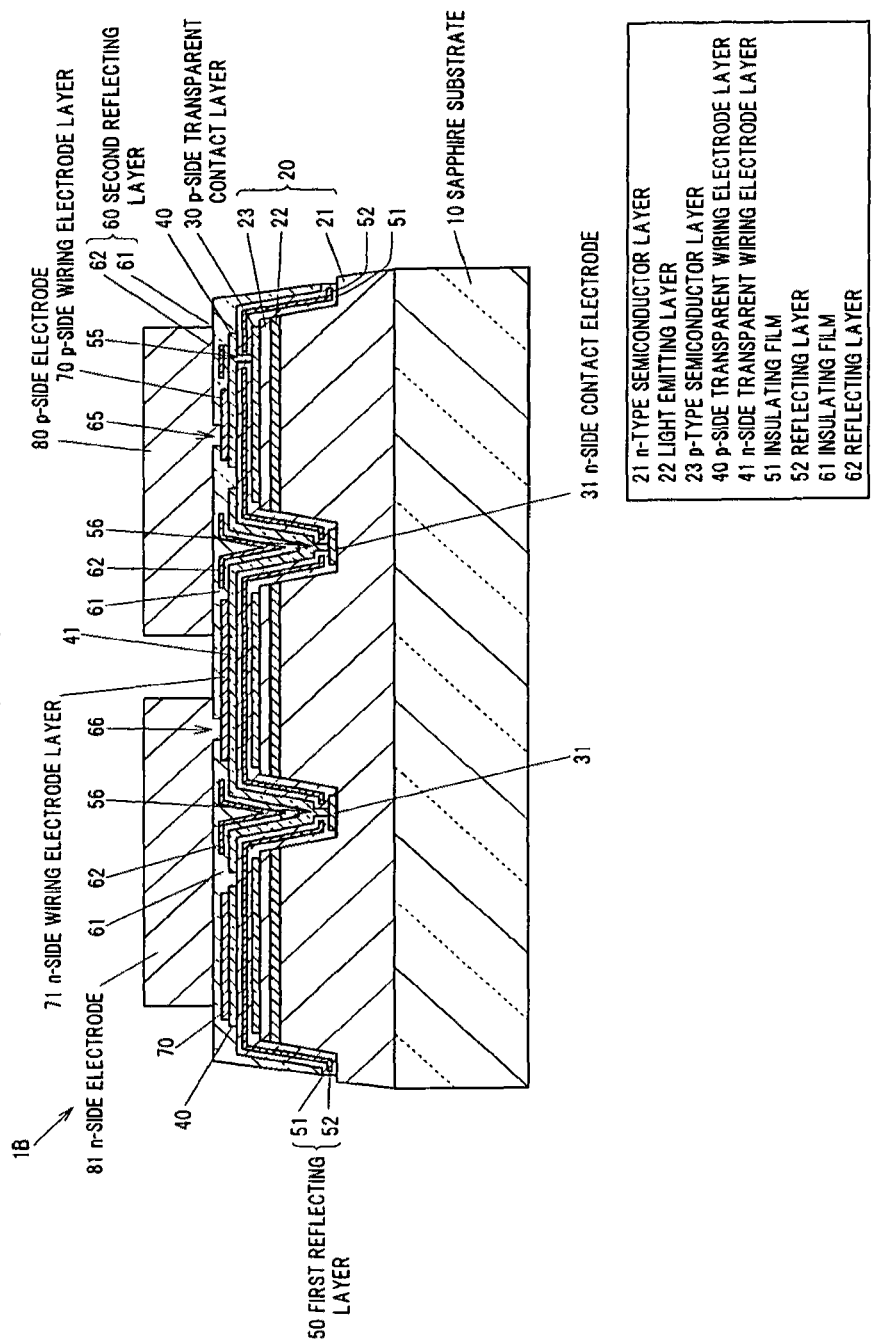

LIGHT EMITTING ELEMENT

The present application is based on Japanese patent application Nos. 2010-190779 and 2011-128390 filed on Aug. 27, 2010 and Jun. 8, 2011. respectively, the entire contents of which are incorporated herein by reference.

BACKGROUND OF THE INVENTION

1. Field of the Invention

This invention relates to a light emitting element with a structure to reflect light emitted therein in a light extracting direction thereof.

2. Description of the Related Art

Heretofore, a light emitting element of a flip-chip type in which a p-type electrode and an n-type electrode are formed in the same surface of a nitride semiconductor formed on a sapphire substrate is known (for example. JP-A-2008-288548). The light emitting element disclosed in JP-A-2008-288548 has a light emitting layer between a p-type semiconductor layer and an n-type semiconductor layer, and a diffusion electrode having translucency composed of Indium Tin Oxide (ITO) or the like is formed on the p-type semiconductor layer. A buffer electrode obtained by stacking Ni and Al in order and then heating so as to alloy is formed on the diffusion electrode. In addition, a metallic reflecting film for reflecting a light emitted from the light emitting layer and having passed through the diffusion electrode is formed in a part above the diffusion electrode other than the buffer electrode.

SUMMARY OF THE INVENTION

The light emitting element disclosed in JP-A-2008-288548 may operate such that a part of light emitted from the light emitting layer and passing through the diffusion electrode is reflected by the metallic reflecting film, but the other part of the light is absorbed by the buffer electrode or n-electrode. Therefore, the light emitting element is limited in the enhancement of light extraction efficiency.

Accordingly, it is an object of the invention to provide a light emitting element that can be enhanced in the light extraction efficiency in extracting a light emitted from a light emitting layer thereof.

(1) According to one embodiment of the invention, a light emitting element comprises:

a semiconductor laminate structure comprising a first semiconductor layer of a first conductivity type, a light emitting layer, and a second semiconductor layer of a second conductivity type different from the first conductivity type, a part of the second semiconductor layer and the light emitting layer being removed to expose a part of the first semiconductor layer;

a first reflecting layer on the semiconductor laminate structure and comprising an opening, the opening being formed in the exposed part of the first semiconductor layer;

a transparent wiring electrode for carrier injection into the first semiconductor layer or the second semiconductor layer through the opening; and a second reflecting layer formed on the transparent wiring electrode and covering a part of the opening so as to reflect light emitted from the light emitting layer and passing through the opening back to the first semiconductor layer.

In the above embodiment (1) of the invention, the following modifications and changes can be made.

(i) The light emitting element further comprises:

a contact electrode comprising a transparent conducting layer, one surface of which contacts the transparent wiring electrode and an other surface of which contacts the first semiconductor layer or the second semiconductor layer.

(ii) The contact electrode comprises a same electrode material as the transparent wiring electrode.

(iii) The first reflecting layer is formed on a part of the contact electrode of the first semiconductor layer or the second semiconductor layer.

(iv) The light emitting element further comprises:

an insulating layer formed in between the first reflecting layer and the second reflecting layer and/or in between the first reelecting layer and the transparent wiring electrode.

(v) The light emitting element further comprises:

a metallic wiring electrode formed at a region on the first reflecting layer and except the opening, and electrically connected to the transparent wiring electrode.

(vi) The first reflecting layer comprises a contact electrode of the second semiconductor layer.

(vii) The transparent wiring electrode contacts the first semiconductor layer.

(viii) A contact electrode of the first semiconductor layer comprises a transparent conducting layer, and the transparent wiring electrode contacts the transparent conducting layer.

(ix) The light emitting element is of a flip-chip type so as to extract light emitted from the light emitting layer in a direction of across the semiconductor laminate structure from the first reelecting layer or the second reflecting layer.

Points of the Invention

According to one embodiment of the invention, a light emitting element is constructed such that a contact electrode on a p-side contact layer of a p-type semiconductor layer is formed of ITO transparent to light emitted from an active layer thereof, a first reflecting layer is formed thereon, and a second reflecting layer is formed on a p-side first insulating film opening of the first reflecting layer in which a p-side transparent wiring electrode layer is disposed. Thereby, the emitted light can be reflected back to the light extracting direction at a high rate without being absorbed by the p-side transparent contact electrode, so that the light extraction efficiency of the light emitting element can be enhanced.

BRIEF DESCRIPTION OF THE DRAWINGS

The preferred embodiments according to the invention will be explained below referring to the drawings, wherein:

FIG. 2A is a cross-sectional view taken along the line A-A in FIG. 1;

FIG. 5 is a plan view schematically showing a structure of a light emitting element according to a third embodiment of the present invention.

DETAILED DESCRIPTION OF THE PREFERRED EMBODIMENTS

First Embodiment

Structure of Light Emitting Element 1

Figure 1:
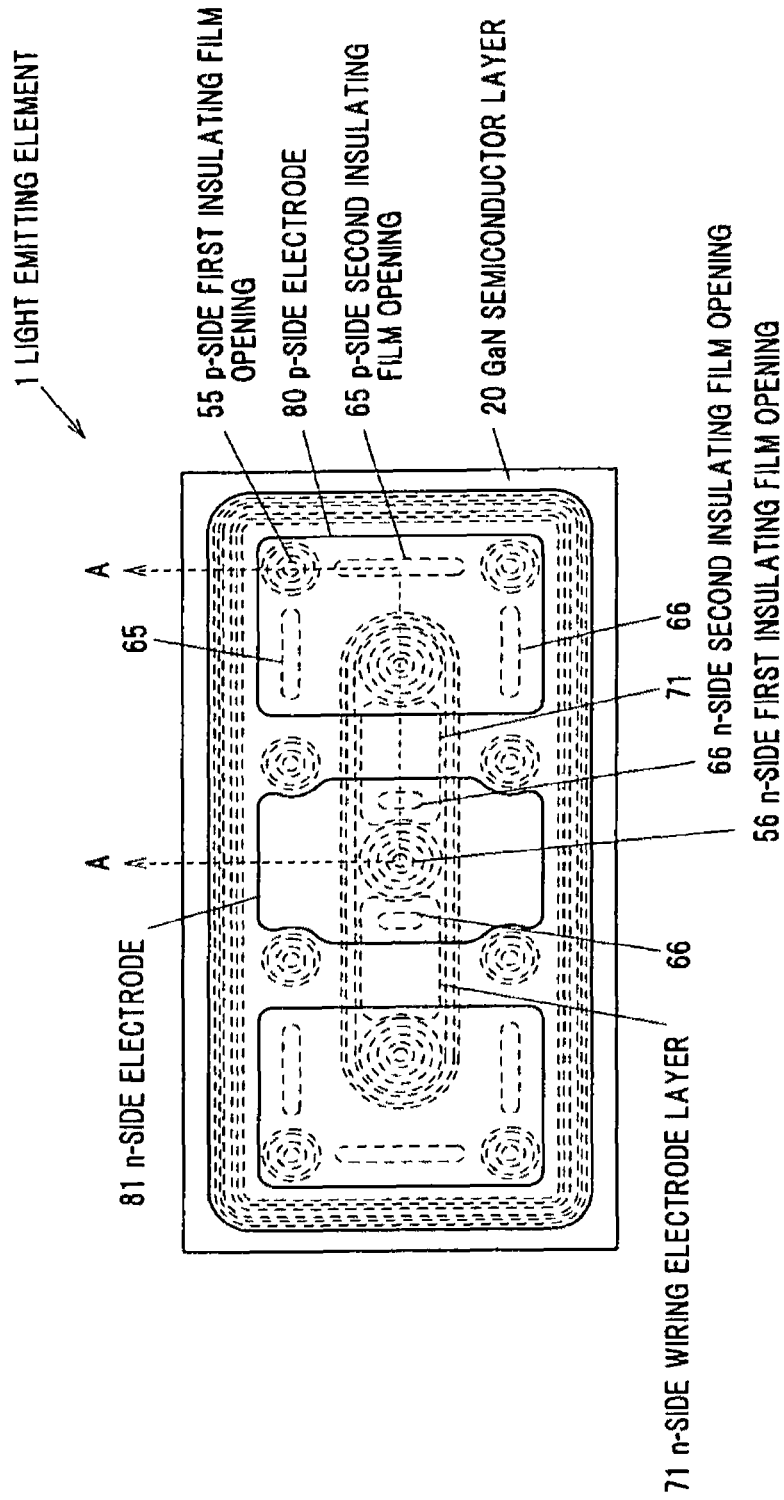
FIG. 1 is a plan view schematically showing a structure of a light emitting element according to a first embodiment of the present invention.
Figure 2B:
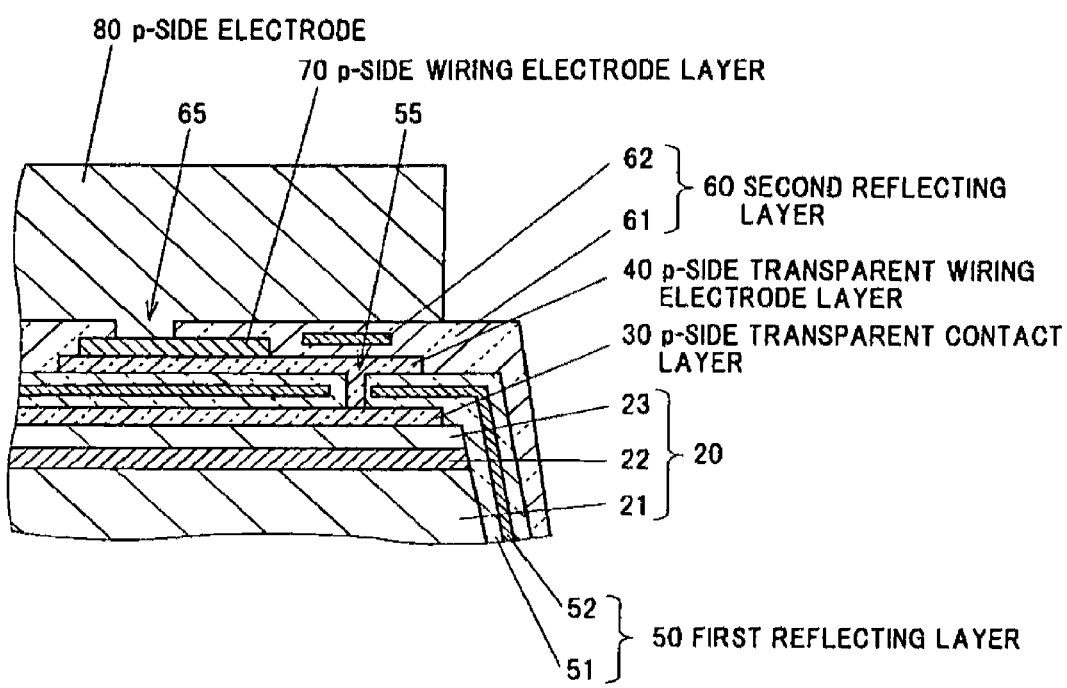
FIG. 2B is a partial enlarged view of FIG. 2A.

FIG. 1 is a plan view schematically showing a structure of a light emitting element according to a first embodiment of the present invention. FIG. 2A is a cross-sectional view taken along the line A-A in FIG. 1 and FIG. 2B is a partial enlarged view of FIG. 2A.

As shown in FIG. 1, the light emitting element 1 according to the first embodiment of the present invention is of a flip-chip type one and is formed so as to have a rectangular shape in a plan view. In addition, as shown in FIG. 2A, the light emitting element 1 includes a sapphire substrate 10 having a c-plane (0001), and a GaN semiconductor layer 20 formed on the sapphire substrate 10. The GaN semiconductor layer 20 has a buffer layer (not shown), an n-type semiconductor layer 21 formed on the buffer layer, a light emitting layer 22 formed on the n-type semiconductor layer 21 and a, p-type semiconductor layer 23 formed on the light emitting layer 22 in this order from the side of sapphire substrate 10.

In addition, the light emitting element 1 includes a p-side transparent contact electrode 30 formed on the p-type semiconductor layer 23, a first reflecting layer 50 for reflecting a light emitted from the light emitting layer 22, and a p-side transparent wiring electrode layer 40 for injecting carriers into the p-type semiconductor layer 23. As shown in FIG. 2A. One surface of the p-side transparent contact electrode 30 comes into contact with the p-side transparent wiring electrode layer 40 and another surface thereof comes into contact with the p-type semiconductor layer 23. The first reflecting layer 50 is formed on the p-side transparent contact electrode 30 and a p-side first insulating film opening 55 is formed in a part of the first reelecting layer 50. In addition, the first reelecting layer 50 is constructed such that a reflecting layer 52 is covered with an insulating film 51. The p-side transparent wiring electrode layer 40 is formed on the first reflecting layer 50, and comes into contact with the p-side transparent contact electrode 30 via a p-side first insulating film opening 55 formed in the first reflecting layer 50 so as to be electrically connected to the p-side transparent contact electrode 30.

Also, the light emitting element 1 includes a p-side wiring electrode layer 70, a second reflecting layer 60 for reflecting the light emitted from the light emitting layer 22, and a p-side electrode 80. The p-side wiring electrode layer 70 is formed in a region located on the p-side transparent wiring electrode layer 40 but not located above the p-side first insulating film opening 55, and is electrically connected to the p-side transparent wiring electrode layer 40. The second reflecting layer 60 has a reflecting layer 62 formed so as to cover at least a part of the p-side first insulating film opening 55 above the p-side transparent wiring electrode layer 40, and is formed on the p-side transparent wiring electrode layer 40 and the p-side wiring electrode layer 70. The reflecting layer 62 is formed so as to reflect the light of the emitting layer 22 having passed through the p-side first insulating film opening 55 toward the light emitting layer 22. In addition, the second reflecting layer 60 is constructed such that the reflecting layer 62 is covered with the insulating film 61. The p-side electrode 80 is formed on the second reflecting layer 60 and comes into contact with the p-side wiring electrode layer 70 exposed from the p-side second insulating film opening 65 formed in the second reflecting layer 60 so as to be electrically connected to the p-side wiring electrode layer 70.

In addition, the light emitting element 1 includes a n-side transparent wiring electrode layer 41 for injecting carriers into the n-type semiconductor layer 21, a n-side wiring electrode layer 71 and an n-side electrode 81. The n-side transparent wiring electrode layer 41 is formed in the upper side of the first reelecting layer 50 on the n-type semiconductor layer 21 exposed by that from the p-type semiconductor layer 23 to at least a part of the contact layer of the n-type semiconductor layer 21 are removed by etching, and comes into contact with the n-type semiconductor layer 21 via the n-side first insulating film opening 56 formed in the first reflecting layer 50 so as to be electrically connected to the n-type semiconductor layer 21. The n-side wiring electrode layer 71 is formed in a region located on the n-side transparent wiring electrode layer 41 but not located above the n-side first insulating film opening 56, and is electrically connected to the n-side transparent wiring electrode layer 41. Also, a reelecting layer 62 of the second reflecting layer 60 is formed so as to cover at least a part of the upper part of the n-side first insulating film opening 56. The n-side electrode 81 is formed on the second reflecting layer 60 so as to be electrically connected to the n-side wiring electrode layer 71 exposed from the n-side second insulating film opening 66 formed in the second reflecting layer 60.

In the embodiment, a mesa portion including the p-type semiconductor layer 23, the light emitting layer 22 and the n-type semiconductor layer 21 is formed by that from the p-side contact layer of the p-type semiconductor layer 23 to a part of n-side contact layer of the n-type semiconductor layer 21 are removed. The mesa portion is formed by that the GaN semiconductor layer 20 is removed in such a way that a part of the n-type semiconductor layer 21 remains, and has an inclined surface inclined to a direction perpendicular to the sapphire substrate 10. The first reflecting layer 50 including the reflecting layer 52 is formed on the inclined surface, and the n-side transparent wiring electrode layer 41 is formed on the first reflecting layer 50. In addition, in the embodiment, the reflecting layer 52 is also formed in the outer edge portion of the light emitting element 1 p-side transparent wiring electrode layer 40.

Each of the n-side contact layer and n-side clad layer constituting the n-type semiconductor layer 21, the light emitting layer 22, and the p-side clad layer and p-side contact layer constituting the p-type semiconductor layer 23 is a layer including a III-group nitride compound semiconductor. As the III-group nitride compound semiconductor includes, for example, a III-group nitride compound semiconductor of $Al_xGa_yIn_{1-x-y}N$ ($0 \leq x \leq 1$, $0 \leq y \leq 1$, $0 \leq x+y \leq 1$) can be used.

The light emitting layer 22 includes a plurality of quantum xvell layers and barrier layers and has a multiple quantum well structure for which materials such as InGaN, GaN, AlGaN are used. In addition, each of the p-side clad layer and p-side contact layer is formed of p-GaN doped with a predetermined amount of p-type dopant such as Mg.

In the embodiment, a material constituting the p-side transparent contact electrode 30 and materials constituting the p-side transparent wiring electrode layer 40 and n-side transparent wiring electrode layer 41 include the same electrode material respectively. In addition a material constituting the p-side wiring electrode layer 70 and a material constituting then-side wiring electrode layer 71 include the same electrode material respectively.

The p-side transparent contact electrode 30, p-side transparent wiring electrode layer 40 and n-side transparent wiring electrode layer 41 include a material having conductive property and translucency to a wavelength of a light emitted from the light emitting layer 22. In the embodiment, the p-side transparent contact electrode 30, p-side transparent wiring electrode layer 40 and n-side transparent wiring electrode layer 41 are formed of an oxide semiconductor, for example, Indium Tin Oxide (ITO). In addition, the insulating films 51, 61 include a material having electrical insulation property and translucency to a wavelength of a light emitted from the light emitting layer 22. The insulating films 51, 61 are mainly formed of, for example, silicon oxide ($SiO_2$).

Also, each of the reflecting layers 52, 62 is formed inside of the insulating films 51, 61, and is formed of a metal material reflecting a light emitted from the light emitting layer 22 such as Al, Ag, Rh, Pt, Pd. It is preferable that the insulating films 51, 61 have a thickness of not less than 0.1 μm and not more than 1.0 μm throughout, and the reflecting layers 52, 62 formed inside of the insulating films 51, 61 have a thickness of not less than 0.05 μm and not more than 0.5 μm for the purpose of reflecting a light having entered the reflecting layers 52, 62 appropriately.

The p-side wiring electrode layer 70 and n-side wiring electrode layer 71 are formed of, for example, a metal material or the like including Ni or Ti, and a metal material or the like including Au. In case that the p-side wiring electrode layer 70 and n-side wiring electrode layer 71 are formed of a layer including Ni or Ti and an Au layer, it is preferable that the Au layer has a thickness of not less than 0.05 μm.

In addition, a solder layer can be formed on the p-side electrode 80 and n-side electrode 81, and the solder layer can be formed of an eutectic material such as AuSn. The solder layer can be formed by, for example, vacuum deposition method such as electron beam deposition method, resistance heating deposition method, sputtering method, plating method, screen printing method and the like. In addition, the solder layer can be also formed of an eutectic solder of an eutectic material other than AuSn or a lead-free solder such as SnAgCu.

The light emitting element 1 constructed as above is a light emitting diode (LED) of a Clip-chip type that emits a light having a wavelength of blue region, and for example, the light emitting element 1 emits a light having a peak wavelength of 455 nm in case that forward voltage is 2.9 V and forward current is 20 mA. The light emitting element 1 has a planar dimension that, for example, the longitudinal dimension and transverse dimension are about 300 μm and 500 μm respectively.

Further, each layer from the butler layer to the p-side contact layer formed on the sapphire substrate can be formed by, for example, Metal Organic Chemical Vapor Deposition (MOVD) method, Molecular Beam Epitaxy (MBE) method. Halide Vapor Phase Epitaxy (HVPE) method and the like respectively. Here, a case that the buffer layer is formed of AlN has been exemplified, but the buffer layer can be also formed of GaN. In addition, the quantum well structure of the light emitting layer 22 is not limited to the multiple quantum well structure, but single quantum well structure and strained quantum well structure can be also used.

In addition, the insulating films 51, 61 can be also formed of a metal oxide such as titanium oxide ($TiO_2$), alumina ($Al_2O_3$), tantalum pentoxide, or a resin material having electrical insulation property such as polyimide. Also, the reflecting layers 52, 62 can be also formed of Ag or an alloy including Al or Ag as a main component. In addition, reflecting layers 52, 62 can also be Distributed Bragg Reflector (DBR) formed of a plurality of layers of two materials different from each other in refractive index Furthermore, the light emitting element 1 can also be a LED emitting a light having a peak wavelength in ultraviolet region, near-ultraviolet region or green region, but the region of the peak wavelength of the light emitted from the LED is not limited to the above-mentioned regions. Further, in the other modifications, the planar dimension of the light emitting element 1 is not limited to the above-mentioned dimension. For example, the planar dimension of the light emitting element 1 can be also designed so as to set the longitudinal and transverse dimensions to be 1000 μm respectively, and so as to set them to be different from each other.

Manufacturing Process of Light Emitting Element 1

Next, a manufacturing process of the light emitting element 1 will be explained. First, the sapphire substrate 10 is prepared, and the GaN semiconductor layer 20 including the n-type semiconductor layer 21, the light emitting layer 22 and the p-type semiconductor layer 23 is formed on the sapphire substrate 10. In particular, the buffer layer, the n-side contact layer, the n-side clad layer, the light emitting layer 22, the p-side clad layer, and the p-side contact layer are epitaxially grown on the sapphire substrate 10 in this order so as to form the GaN semiconductor layer 20 (Semiconductor layer forming step).

FIGS. 3A to 3I are plan views schematically showing one step in a manufacturing process of the light emitting element according to the first embodiment of the present invention, and for the purposes of illustration, each of the FIGS. 3A to 3I shows only a layer formed on the uppermost surface in each of the manufacturing steps.

Figure 3A:
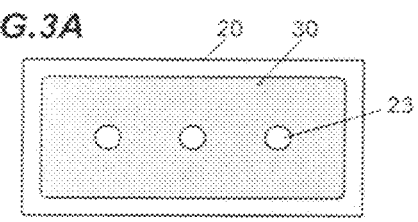
FIGS. 3A to 3I are plan views schematically showing one step in a manufacturing process of the light emitting element according to the first embodiment of the present invention.

First, the p-side transparent contact electrode 30 is formed on the whole surface of the GaN semiconductor layer 20. Then, as shown in FIG. 3A, the p-side transparent contact electrode 30 is patterned by photolithography and etching (e.g. wet etching) to expose the p-type semiconductor layer 23 at regions (i.e., circular regions in FIG. 3A) for forming the n-side first insulating film openings 56 later. In the embodiment, the p-side transparent contact electrode 30 is composed of ITO, and can be formed by, for example, a sputtering method, a vacuum deposition method, a CVD method, a sol-gel process or the like.

Figure 3F:
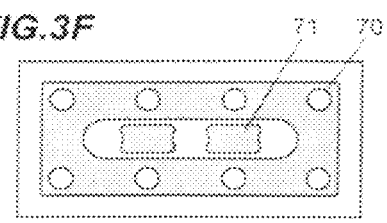
Figure 3B:
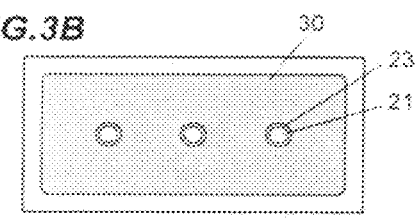

Then, as shown in FIG. 3B, most part of the exposed p-type semiconductor layer 23 within the circular regions is etched by photolithography and etching so as to vertically remove the p-side contact layer of the p-type semiconductor layer 23 down to a part of the n-side contact layer of the n-type semiconductor layer 21. Thus, the mesa portion composed of the plural compound semiconductor layers, i.e., from the n-side contact layer to the p-side contact layer is formed such that a part of the n-side contact layer is exposed.

Then, the insulating film 51 of the first reflecting layer 50 is formed throughout the surface. In particular, the insulating film 51 is formed so as to cover the exposed portions of the p-side transparent contact electrode 30, the mesa portion, and the n-side contact layer. The insulating film 51 can be formed by, for example, a plasma CVD method or a deposition method (First insulating layer forming step in insulating layer forming step).

Figure 3G:
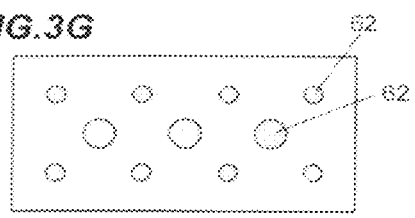
Figure 3C:
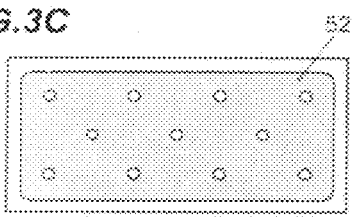

Also, as shown in FIG. 3C, the reflecting layer 52 of the first reflecting layer 50 is formed by using the deposition method and the photolithography technique in a region on the insulating film 51 other than a part in which the p-side first insulating film opening 55 and the n-side first insulating film opening 56 are formed (First reflecting layer forming step in insulating layer forming step).

Figure 3H:
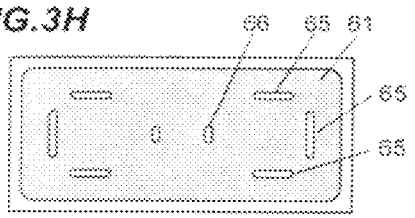
Figure 3D:
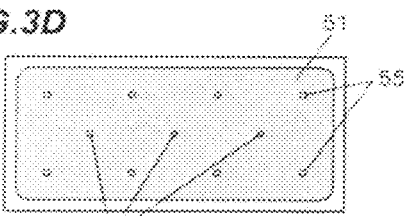

Then, the insulating film 51 is formed again by the plasma CVD method or the deposition method throughout the surface (Second insulating layer forming step in insulating layer forming step). Hereby, the reflecting layer 52 is covered with the insulating film 51. Then, as shown in FIG. 3D, patterning is applied to the insulating film 51 and the reflecting layer 52 so as to form the p-side first insulating film opening 55 and the n-side first insulating film opening 56. In the embodiment, eight the p-side first insulating film openings 55 are formed in the outer edge side of the GaN semiconductor layer 20 in a plan view. In addition, three the n-side first insulating film openings 56 are formed in the center portion of the GaN semiconductor layer 20 in a plan view.

Figure 3I:
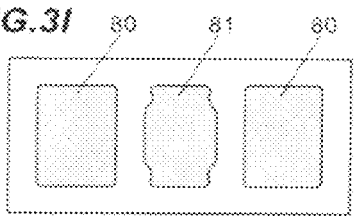
Figure 3E:
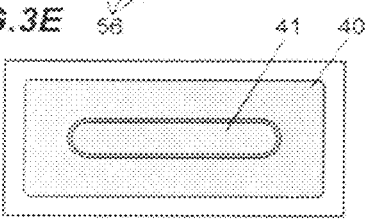

Then, as shown in FIG. 3E, the p-side transparent wiring electrode layer 40 and the n-side transparent wiring electrode layer 41 are formed in a predetermined region on the surface of the first reelecting layer 50 at the same time. At the time, a part of the p-side transparent wiring electrode layer 40 enters into the p-side first insulating film opening 55 and a part of the n-side transparent wiring electrode layer 41 enters into the n-side first insulating film opening 56 so as to come into contact with the p-side transparent contact electrode 30 or the n-type semiconductor layer 21 respectively.

In the embodiment, the p-side transparent wiring electrode layer 40 is formed of the same material as that of the n-side transparent wiring electrode layer 41, and as the material. ITO is used. The p-side transparent wiring electrode layer 40 and the n-side transparent wiring electrode layer 41 are formed by using, for example, the sputtering method. Further, the p-side transparent wiring electrode layer 40 and the n-side transparent wiring electrode layer 41 can be also formed by the vacuum deposition method, the CVD method, the deposition method, the sol-gel process or the like.

Then, as shown in FIG. 3F, each of the p-side wiring electrode layer 70 and the n-side wiring electrode layer 71 is formed in a predetermined partial region of the surfaces of the p-side transparent wiring electrode layer 40 and the n-side transparent wiring electrode layer 41 at the same time by using the vacuum deposition method and the photolithography technique.

Then, the insulating film 61 of the second reflecting layer 60 is formed by the plasma CVD method or the deposition method throughout the surface. In particular, the insulating film 61 is formed by the plasma CVD method or the like so as to cover the p-side wiring electrode layer 70, the n-side wiring electrode layer 71, the p-side transparent wiring electrode layer 40, the n-side transparent wiring electrode layer 41, (the exposed part of the n-side contact layer) and the first reflecting layer 50 (Third insulating layer forming step in insulating layer forming step).

Then, as shown in FIG. 3G, the reflecting layer 62 of the second reflecting layer 60 is formed above the p-side first insulating film opening 55 and the n-side first insulating film opening 56 by using the deposition method or the plasma CVD method so as to cover the p-side first insulating film opening 55 and the n-side first insulating film opening 56 (Second reflecting layer forming step in insulating layer forming step).

Then, the insulating film 61 of the second reflecting layer 60 is formed again by the plasma CVD method or the deposition method throughout the surface (Fourth insulating layer forming step in insulating layer forming step). Hereby, the reflecting layer 62 is covered with the insulating film 61. Then, as shown in FIG. 3H, patterning is applied to the insulating film 61 and the reelecting layer 62 so as to form the p-side second insulating film opening 65 and the n-side second insulating film opening 66.

Then, as shown in FIG. 3I, the p-side electrode 80 and the n-side electrode 81 are formed at the same time via each of the p-side second insulating film opening 65 and the n-side second insulating film opening 66 and so as to cover the openings 65, 66 by using the vacuum deposition method and the photolithography technique (External electrode forming step). The p-side electrode 80 formed in the p-side second insulating film opening 65 is electrically connected to the p-side wiring electrode layer 70, and simultaneously the n-side electrode 81 formed in the n-side second insulating film opening 66 is electrically connected to the n-side wiring electrode layer 71. Via the above-mentioned steps, the light emitting element 1 is manufactured.

The light emitting element 1 manufactured via the above-mentioned steps is mounted by a flip-chip bonding on a predetermined location of a wiring substrate including ceramic or the like in which a wiring pattern of a conductive material is preliminarily formed. Then, the light emitting element 1 mounted on the substrate is integrally sealed with a sealing material such as epoxy resin, silicone resin, glass, so that the light emitting element 1 can be packaged as a light emitting device.

Operation

The light emitting element 1 emits a light from the light emitting layer 22 by applying voltage to the p-side electrode 80 and the n-side electrode 81. A part of the light is emitted from the light emitting layer 22 toward the side of sapphire substrate 10 that is a light extracting direction, and the other part of the light is emitted laterally or toward the side of p-side transparent contact electrode 30.

A part of the light emitted toward the side of p-side transparent contact electrode 30 of the emission light of the emitting layer 22 is reflected to the light extracting direction by the first reflecting layer 50, and the other part passes through the p-side first insulating film opening 55 and is reflected to the light extracting direction by the second reflecting layer 60.

Also, the light emitted toward the side of sapphire substrate 10 of the emission light may be reflected to the side of p-side transparent contact electrode 30 by the interface between the GaN semiconductor layer 20 and the sapphire substrate 10, but the light is also reflected to the light extracting direction by the first reflecting layer 50 or the second reflecting layer 60 after passing through the p-side first insulating film opening 55 and the n-side first insulating film opening 56.

Effects of the First Embodiment

The light emitting element 1 according to the embodiment has a structure that the contact electrode formed on the p-side contact layer of the p-type semiconductor layer 23 includes ITO transparent to the emission light, the first reflecting layer 50 is formed thereon, and further the second reflecting layer 60 is formed above the p-side first insulating film opening 55 of the first reflecting layer 50 on which the p-side transparent wiring electrode layer 40 is formed, thereby the emission light can be reflected to the light extracting direction at high rates without absorbing the light by the p-side transparent contact electrode 30, so as to enhance a light extraction efficiency of the emission light.

In addition, the p-side wiring electrode layer 70 and the n-side wiring electrode layer 71 into which the emission light does not enter are not needed to have a function of a reflecting layer, thus even if the reflectance thereof is low, it does not have a large influence on the light extracting efficiency. Therefore, various materials having low resistance can be selected as the p-side wiring electrode layer 70 and the n-side wiring electrode layer 71. Accordingly, even if the sheet resistance of the transparent wiring electrode is high, carrier diffusivity of the light emitting element 1 can be enhanced and the whole driving voltage can be reduced.

In addition, even if the number of the p-side first insulating film opening 55 and the n-side first insulating film opening 56 is increased, a part in which the reflectance of the emission light is low is not increased and the emission area is not reduced, thus a plurality of contacts between the p-side transparent wiring electrode layer 40 and the p-side transparent contact electrode 30, and a plurality of contacts between then-side transparent wiring electrode layer 41 and the n-type semiconductor layer 21 can be formed while maintaining the light intensity, so that the driving voltage can be reduced.

Second Embodiment

Figure 4:
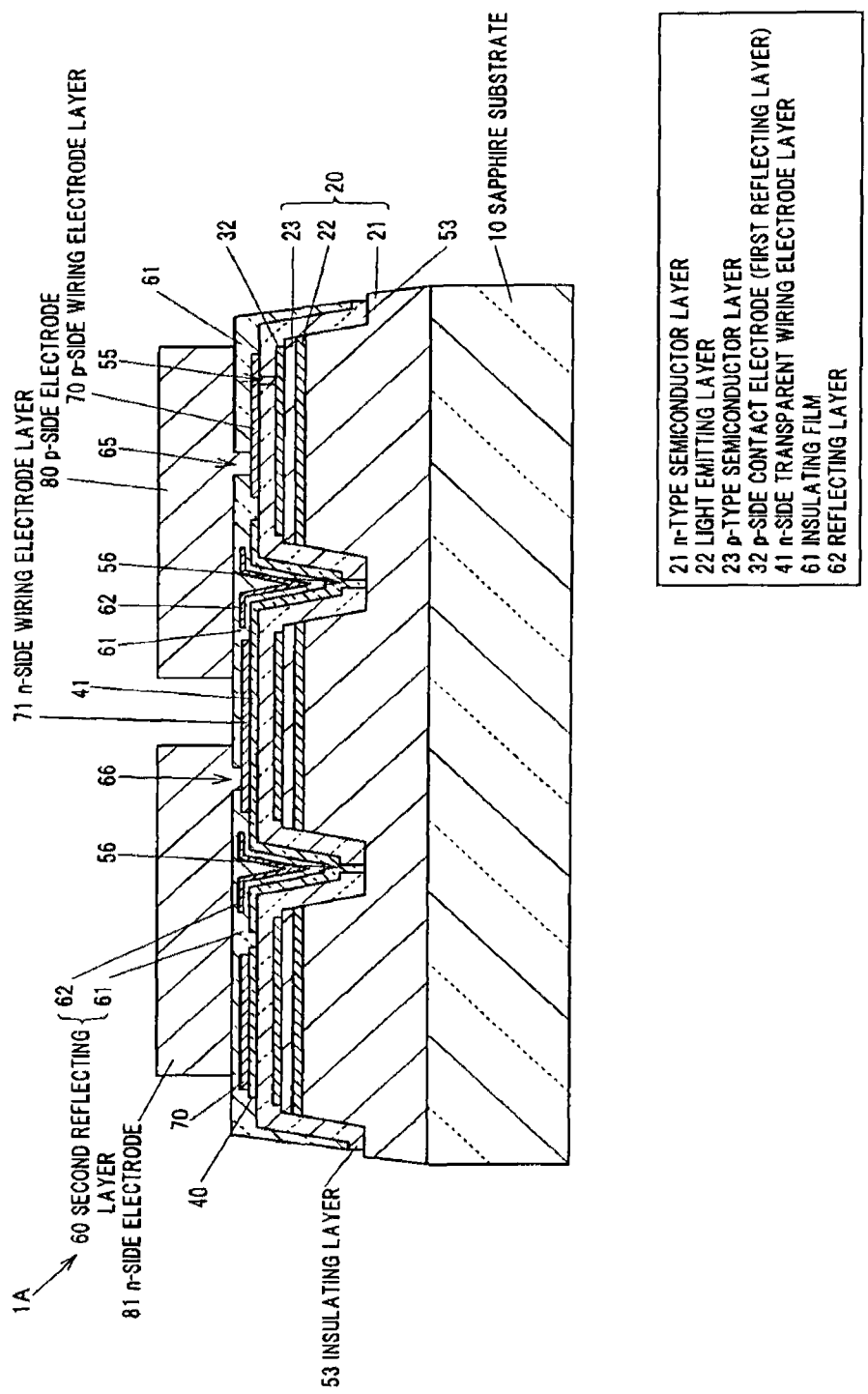
FIG. 4 is a plan view schematically showing a structure of a light emitting element according to a second embodiment of the present invention.

FIG. 4 is a plan view schematically showing a structure of a light emitting element 1A according to a second embodiment of the present invention.

The light emitting element 1A has a structure that the p-side transparent contact electrode 30 of the light emitting element 1 according to the first embodiment is changed to the p-side contact electrode 32 including a high reflective material such as Ag, Rh being not transparent, and an insulating film 53 that does not have a reflective layer is formed instead of the first reflecting layer 50 of the first embodiment. Namely, in the light emitting element 1A, the p-side contact electrode 32 functions as the first reflecting layer. In addition, a region in which a part of the n-type semiconductor layer 21 is exposed functions as the openings.

Operation

The light emitting element 1A emits a light from the light emitting layer 22 by applying voltage to the p-side electrode 80 and the n-side electrode 81. A part of the light is emitted from the light emitting layer 22 toward the side of sapphire substrate 10 that is a light extracting direction, and the other part of the light is emitted toward the side of p-side contact electrode 32.

The light emitted toward the side of p-side contact electrode 32 is reelected to the side of sapphire substrate 10 by the surface of the p-side contact electrode 32. Also, a part of the light emitted toward the side of sapphire substrate 10 is reflected to the mesa portion or the n-side contact layer by the interface between the GaN semiconductor layer 20 and the sapphire substrate 10 so as to be reflected to the light extracting direction by the reflecting layer 62 of the second reflecting layer 60.

Effects of the Second Embodiment

The light emitting element 1A according to the embodiment has a structure that the n-side transparent wiring electrode layer 41 formed on the n-side contact layer of the n-type semiconductor layer 21 includes ITO transparent to the emission light, and the second reelecting layer 60 is formed thereon, thereby the emission light can be reelected to the light extracting direction at high rates without absorbing the light by the n-side transparent wiring electrode layer 41, so as to enhance a light extraction efficiency of the emission light.

Third Embodiment

FIG. 5 is a plan view schematically showing a structure of a light emitting element 1B according to a third embodiment of the present invention.

The light emitting element 1B differs from the light emitting element 1 according to the first embodiment in having a structure that the n-side contact electrode 31 is formed between the n-side contact layer of the n-type semiconductor layer 21 and the n-side transparent wiring electrode layer 41. The n-side contact electrode 31 is formed of a material having conductive property and translucency to a wavelength of a light emitted from the light emitting layer 22, and is formed of the same electrode material as that of the n-side transparent wiring electrode layer 41. The n-side contact electrode 31 is formed of, for example, ITO.

As shown in FIG. 5, one surface of the n-side contact electrode 31 comes into contact with the n-side transparent wiring electrode layer 41, and another surface comes into contact with the n-type semiconductor layer 21 so as to be electrically connected to each other.

Operation

A part of the light emitted toward the side of p-side transparent contact electrode 30 of the emission light is reflected to the light extracting direction by the first reelecting layer 50, and the other part passes through the p-side first insulating film opening 55 so as to be reelected to the light extracting direction by the second reflecting layer 60.

Also, a part of the light emitted toward the side of sapphire substrate 10 of the emission light is reelected by the interface between the GaN semiconductor layer 20 and the sapphire substrate 10, and further a part thereof passes through the n-side contact electrode 31 so as to be reflected to the light extracting direction by the first reflecting layer 50 or second reelecting layer 60.

Effects of the Third Embodiment

The light emitting element 1B according to the embodiment has a structure that the contact electrodes formed on the contact layers of the p-side contact layer of the p-type semiconductor layer 23 and the n-type semiconductor layer 21 include a material transparent to the emission light, the first reflecting layer 50 is formed thereon, and further the second reelecting layer 60 is formed above the p-side first insulating film opening 55 and the n-side first insulating film opening 56, thereby the emission light can be reflected to the light extracting direction at high rates without absorbing the light by the p-side transparent contact electrode 30 or the n-side contact electrode 31, so as to enhance a light extraction efficiency of the emission light. In addition, the n-side contact electrode 31 and the n-side transparent wiring electrode layer 41 are formed separately, consequently a high temperature treatment applying heat to the n-side contact electrode 31 is carried out after the n-side contact electrode 31 has been formed and before the first reflecting layer 50 is formed, thereby contact resistance between the n-side contact electrode 31 and the n-type semiconductor layer 21 can be reduced without damaging the first reflecting layer 50 due to heat.

Although the invention has been described with respect to the specific embodiments for complete and clear disclosure, the appended claims are not to be thus limited but are to be construed as embodying all modifications and alternative constructions that may occur to one skilled in the art which fairly, fall within the basic teaching herein set forth. The entire contents of patents or publications of patent applications exhibited herein are incorporated herein by reference.

What is claimed is:

1. A light emitting element, comprising:
   a semiconductor laminate structure comprising a first semiconductor layer of a first conductivity type, a light emitting layer, and a second semiconductor layer of a second conductivity type different from the first conductivity type, a part of the second semiconductor layer and the light emitting layer being removed to expose a part of the first semiconductor layer;
   a first reflecting layer on the semiconductor laminate structure and comprising an opening, the opening being formed in the exposed part of the first semiconductor layer;
   a transparent wiring electrode for carrier injection into the first semiconductor layer or the second semiconductor layer through the opening;

a second reflecting layer formed on the transparent wiring electrode and covering a part of the opening so as to reflect light emitted from the light emitting layer and passing through the opening back to the first semiconductor layer;

a contact electrode comprising a transparent conducting layer, one surface of which contacts the transparent wiring electrode and an other surface of which contacts the first semiconductor layer or the second semiconductor layer;

an insulating layer formed in between the first reflecting layer and the second reflecting layer and/or in between the first reflecting layer and the transparent wiring electrode; and a metallic wiring electrode formed at a region on the first reflecting layer and except the opening, and electrically connected to the transparent wiring electrode.

2. The light emitting element according to claim 1, wherein the contact electrode comprises a same electrode material as the transparent wiring electrode.

3. The light emitting element according to claim 1, wherein the first reflecting layer is formed on a part of the contact electrode of the first semiconductor layer or the second semiconductor layer.

4. The light emitting element according to claim 1, wherein the first reflecting layer comprises a contact electrode of the second semiconductor layer.

5. The light emitting element according to claim 4, wherein the transparent wiring electrode contacts the first semiconductor layer.

6. The light emitting element according to claim 4, wherein a contact electrode of the first semiconductor layer comprises a transparent conducting layer, and the transparent wiring electrode contacts the transparent conducting layer.

7. The light emitting element according to claim 1, wherein the light emitting element comprises a flip-chip type so as to extract light emitted from the light emitting layer in a direction of across the semiconductor laminate structure from the first reflecting layer or the second reflecting layer.

8. The light emitting element according to claim 7, wherein the first reflecting layer comprises a contact electrode of the second semiconductor layer.

9. The light emitting element according to claim 8, wherein the transparent wiring electrode contacts the first semiconductor layer.

* * * * *